(12) United States Patent
Lin

(10) Patent No.: US 6,755,982 B2
(45) Date of Patent: Jun. 29, 2004

(54) SELF-ALIGNED MICRO HINGES

(75) Inventor: Chuang-Chia Lin, San Pablo, CA (US)

(73) Assignee: Xerox Corporation, Stamford, CT (US)

( * ) Notice: Subject to any disclaimer, the term of this patent is extended or adjusted under 35 U.S.C. 154(b) by 189 days.

(21) Appl. No.: 10/040,687

(22) Filed: Jan. 7, 2002

(65) Prior Publication Data

US 2003/0129374 A1 Jul. 10, 2003

(51) Int. Cl.⁷ .............................................. H01L 21/00
(52) U.S. Cl. .............................. 216/2; 216/79; 216/67; 216/83
(58) Field of Search ................................ 216/2, 67, 79, 216/83; 438/52; 361/283.4

(56) References Cited

U.S. PATENT DOCUMENTS

| | | | |
|---|---|---|---|
| 5,493,470 A | * | 2/1996 | Zavracky et al. ............. 438/53 |
| 5,759,870 A | * | 6/1998 | Yun et al. ...................... 438/53 |
| 2001/0055831 A1 | * | 12/2001 | Daneman et al. ............. 438/51 |

OTHER PUBLICATIONS

Surface Micromachining for Microelectromechanical Systems; James M. Bustillo, Roger T. Howe, Richard S. Muller; Aug. 1998; pp. 1552–1574.
Microfabricated Hinges; K.S.J. Pister, M.W. Judy, S.R. Burgett, R.S. Fearing; Mar. 4, 1992; pp. 249–256.

* cited by examiner

Primary Examiner—Nadine G. Norton
Assistant Examiner—Shamim Ahmed
(74) Attorney, Agent, or Firm—Perman & Green, LLP

(57) ABSTRACT

A surface micromachining process for the fabrication of three-dimensional micro-hinges directly on silicon on insulator wafers. The process includes the steps of (a) defining openings around the surface of a desired hinge pin in a single layer of a silicon single crystal; (b) subjecting the openings to an etching process for removal of oxide material that is located in contiguous relation to the openings under the area of a hinge; (c) growing thermal oxide to define a gap between the hinge pin and a subsequently deposited polysilicon cap; (d) immediately depositing a thin layer of a chemical vapor deposited oxide sufficient to cover fine gaps not completely covered by the thermal oxide; depositing polysilicon and etching to define a hinge cap; and further etching to allow a mirror to be lifted out of the silicon wafer.

5 Claims, 10 Drawing Sheets

FIG. 1A
PRIOR ART
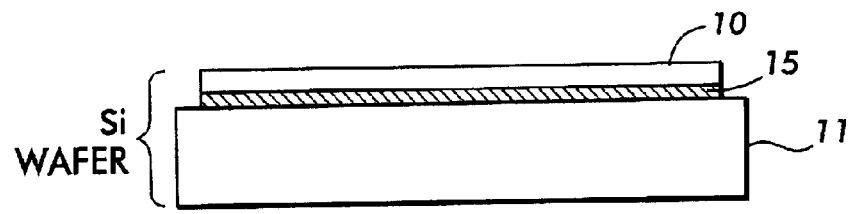
FIG. 1B
PRIOR ART
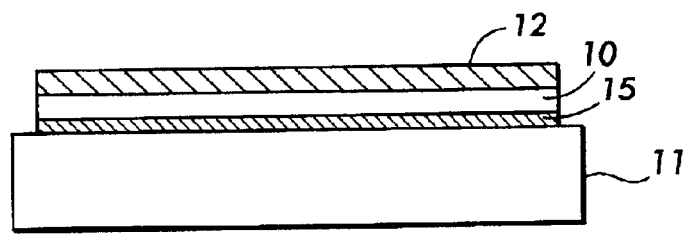
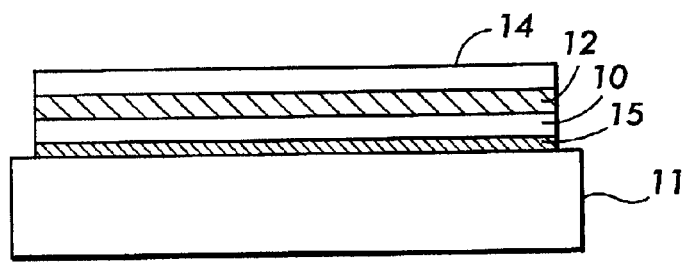
FIG. 1C
PRIOR ART

FIG. 2
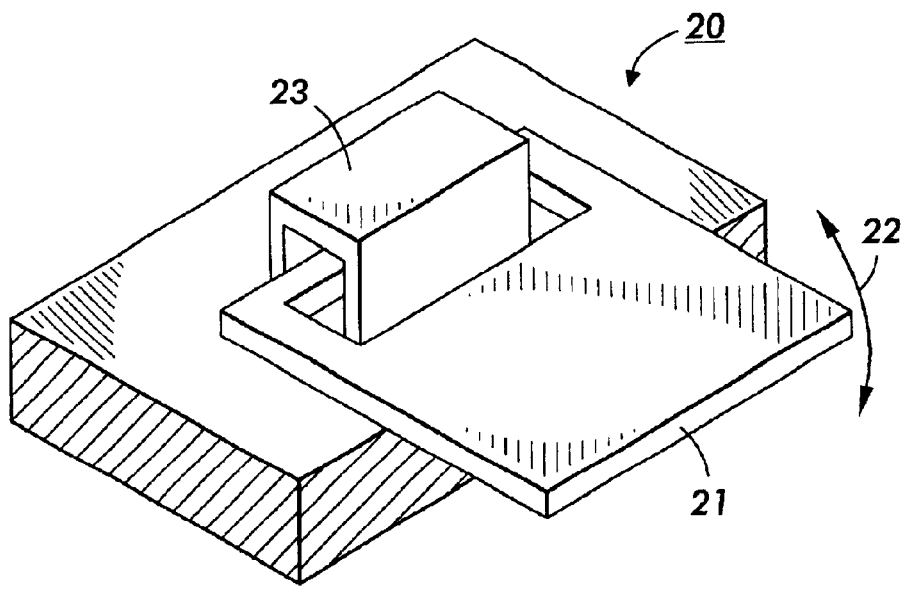
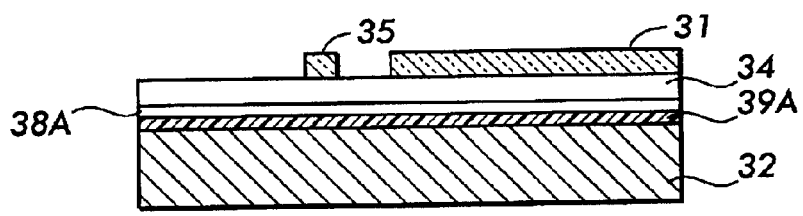
FIG. 3
PRIOR ART
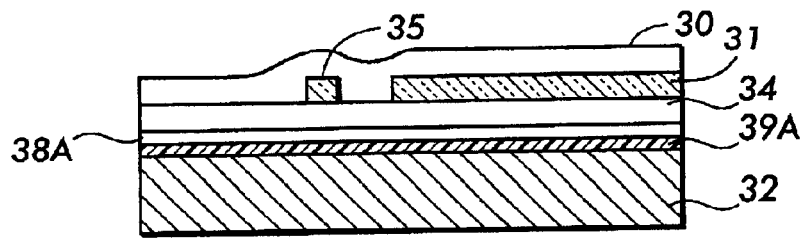
FIG. 4
PRIOR ART

SELF-ALIGNED MICRO HINGES

BACKGROUND OF THE INVENTION

1. Field of the Invention

This invention relates to a process for the fabrication of micro hinges by a surface micro-machining method. More particularly, it relates to a process that enables the fabrication of self-aligned micro hinges on silicon on insulator (SOI) wafers. The unique silicon structure can be used in a micro-electro-mechanical system (hereinafter "MEMS") that requires free-rotating hinged micro elements.

2. Description of the Prior Developments

Microdevices based on micron and millimeter scale microelectromechanical systems (MEMS) technology are widely used in microsensors, microfluidic controls systems, and micromachines. Currently, MEMS sensors are used in a very wide variety of fields such as automobiles, medical instrumentation and process control applications. In such use accurate determinations of pressure, temperature, acceleration, gas concentration, and many other physical or chemical states can be provided by tightly packed tiny sensors. In part because of the ease of associating and integrating electronic control circuitry (using VLSI techniques), microdevices are commonly constructed from semiconductor material substrates such as crystalline silicon, commercially available in the form of semiconductor wafers as used for the production of integrated circuits. Unfortunately, such wafer type substrates are limited in size in that they generally have a circular diameter of only about ten to twenty centimeters and less than one millimeter thick. Since many potential applications of MEMS require arrays of microdevices distributed on a centimeter scale in all three dimensions, significant costs are associated with the construction, distribution, attachment, and interconnection of large microdevice arrays based on silicon substrates. A low cost and reliable construction method that enables one to effectively and efficiently manufacture three dimensional MEMS is at the core of state-of-the-art research dealing with this type of technology.

One major branch of three dimensional (3D) MEMS evolves around the concept of micro hinges fabricated by a surface micro-machining method. The traditional microfabrication process was somewhat limited because it could only build strictly two-dimensionally (2D) extruded devices. Micro hinges revolutionized the microelectromechanical system (MEMS) world by permitting the fold-up of what was originally flat, two-dimensional parts. Parts are still built in-plane, but are hinged or chained together as built. At the end of the process, they are folded out-of-plane and latched together. Many complicated structures were built using this method, and the applications include micro optics (e.g. optical switches), sensors, and actuators. Examples of some of the first work that has been done in this area of technology are described in Sensors Actuator A, vol. 33, pp. 249–256, 1992 by K. S. J. Pister, et al. entitled "Microfabricated hinges", and a recent summary is in the Proc. of the IEEE, vol. 86, pp. 1552–1574, 1998 by J. Bustillo, R. T. Howe and R. S. Muller entitled "Surface Micromachining for Microelectromechanical Systems."

However, the negative element about the technology described in these articles is that the original process techniques for fabricating micro-hinges or hinge joints by a surface micro-machining method, and the original hinge designs have many disadvantages. One particular disadvantage is the complexity of the process used for manufacturing these hinges. Known process techniques require deposition of at least five layers of film (e.g., three layers of polysilicon and two layers of silicon dioxide) along with the associated lithography techniques to complete the process. In particular, the fabrication process becomes extremely complicated if one attempts to directly integrate this process with a silicon on insulator (SOI) wafer.

There is illustrated in FIG. 1A, FIG. 1B and FIG. 1C a basic known technique for surface micromachining on a silicon on insulator (SOI) wafer which falls into the area of technology designated as the prior art. FIG. 1A illustrates how one starts with a layer of silicon 10 on an insulator 15 and a silicon substrate 11. FIG. 1B illustrates that a layer of material, i.e. silicon dioxide 12 is then deposited on the silicon. FIG. 1C then shows that a layer of a photoresist 14 material is then deposited on the silicon dioxide. The structure is then irradiated under a binary photomask, the photoresist is developed and excess photoresist material removed. Thereafter, one etches to remove exposed material 12, and/or layer 10 as well. Right after any remaining photoresist is stripped. All of these process steps are repeated for each of the structural and sacrificial layers. To build a floating hinge, three layers of polysilicon and two layers of silicon dioxide are needed.

The complexity grows exponentially as more layers are added if a proper connection between the layers are required. For example, only one step of photolithgraphy and etch is needed for the first layer. But for the third layer to connect to both the first and second layers, another etch is needed to open holes at the second layer. The associated cost of manufacturing goes up with the complexity of the process. Furthermore, the thickness and the exact number of layers of the various materials can create a large topography and stress problem. Large topography prevents proper lithography that defines the feature size. Stress can cause cracking problems.

SUMMARY OF THE INVENTION

A primary objective of the features of the present invention is to provide a fabrication process which avoids the above described disadvantages.

It is also a primary objective of the present invention to provide a simple approach to permit the construction of micro-hinges on silicon on insulator wafers then has previously been known before. It is an additional objective of the present invention to describe a surface micromachining process for the fabrication of three-dimensional micro-hinges with tighter hinge tolerance than exhibited by known structures because the hinge pivotable portion of the micro-hinge structure is self aligned to the hinge staple portion.

The above described objectives, and others, are obtained in accordance with the preferred features of the present invention by employing a surface micromachining process for the fabrication of three-dimensional micro-hinges directly on silicon on insulator wafers comprising the steps of: (a) defining openings around the surface of a desired hinge pin in a single layer of a silicon single crystal; (b) subjecting the openings to an etching process for removal of oxide material that is located in contiguous relation to the openings under the area designated for a hinge; (c) growing thermal oxide to define a gap between a hinge pin and a subsequently deposited polysilicon cap; (d) depositing polysilicon and etching to define a hinge cap/staple; and (e) wet etching to remove grown oxide and allow a pin to rotate inside the cap/staple. A connected mirror structure can be lifted out of the silicon wafer.

BRIEF DESCRIPTION OF THE DRAWINGS

The foregoing aspects and other features of the present invention are explained in the following description, taken in connection with the accompanying drawings, wherein:

FIG. 1A, FIG. 1B and FIG. 1C are a series of plan views illustrating a prior art approach to fabricate MEMS;

FIG. 2 is a three dimensional view of a typical micro staple hinge;

FIGS. 3–8 are a series of plan views illustrating the various specific steps in the prior art that are employed in manufacturing micro staple hinges;

DETAILED DESCRIPTION OF THE PREFERRED EMBODIMENT(S)

Figure 5:
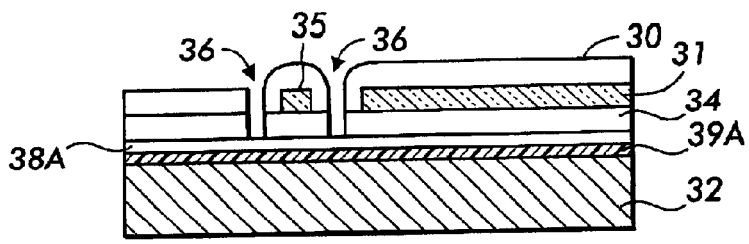
Figure 6:
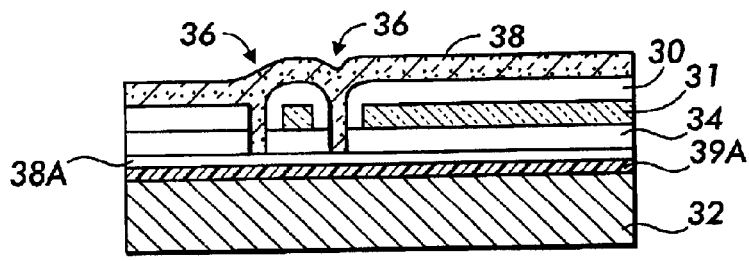

The features of the present invention describe a novel method of building micro hinges on top of silicon on insulator (SOI) wafers. The method allows fabrication of hinges that can be lifted out of a wafer plane though the method requires only one polysilicon deposition and greatly reduces process complexity and cost. The hinges manufactured by this invention are self aligned and have much tighter tolerance than the traditional polysilicon hinges (which typically requires deposition of three polysilicon layers). In addition, the process according to the present invention also allows the moving plate to be built completely out of single crystal silicon, and significantly reduces the stress and fatigue failure issues associated with polysilicon mirrors.

The process according to the invention can be extended to traditional surface micro machining to reduce the required number of layers of polysilicon by a deposition technique. The application is very broad and can be employed with regard to many movable micro devices, particularly micro optical switches, micro spectral analyzer, micro display, and electric-paper.

As illustrated in FIG. 2, the structure for a typical micro staple hinge 20 is composed of a hinge flap or plate 21 that can rotate as per arrow 22 and a hinge staple 23. The flap 21 and staple 23 are connected to separated structures. These are free to rotate relative to each other as per arrow 22.

Figure 7:
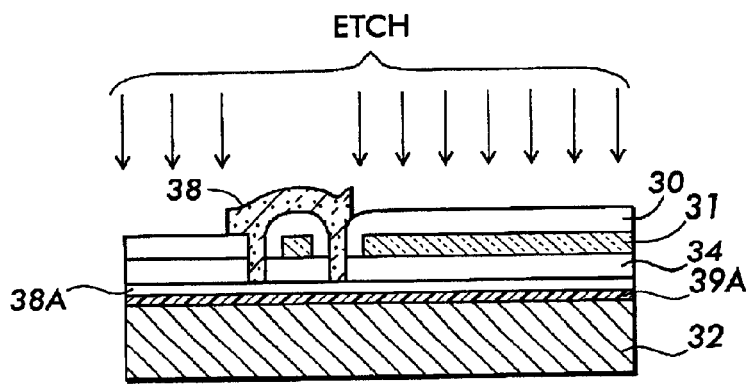
Figure 8:
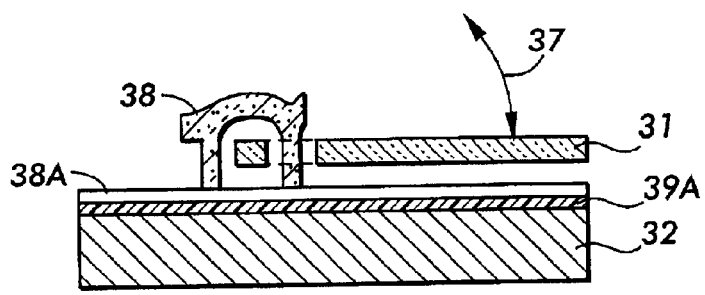

Hinges as described herein are typically built by a surface micromachining process. The process employed in the prior art is illustrated in FIG. 3 through FIG. 8, wherein a sacrificial layer 30 (silicon oxide) is usually deposited on top of the polysilicon structure 31 that has a hinge post 35 pre-defined (FIGS. 3 and 4). Both 31 and 35 are formed of polysilicon (layer 1). Layer 34 is a silicon dioxide layer. Substrate 32 can be covered by a polysilicon layer 38A and a silicon nitride insulation layer 39A which are both used to prevent charging. Anchor holes 36 are etched at both sides of the post 35 through both layers 30 and 34 (FIG. 5), followed by deposition of the polysilicon layer 38. (FIG. 6) This polysilicon layer 38 is patterned and etched to form the staple that surrounds the post. At the end of the process, the sacrificial materials are removed by etching (FIG. 7). The remaining polysilicon structures are then allowed to move in the direction of arrow 37 and rotate to fold into the structure. (FIG. 8) If the plate that has the post needs to be moved out of plane, the layer 32 needs to be physically separated from the substrate (FIG. 8).

The above designed process is fairly difficult to integrate if a silicon on insulator (SOI) (FIG. 1A) wafer is used. There is a desire to use a SOI wafer and it is a popular choice in building optical devices because it provides a single crystal silicon layer that exhibits consistent properties as compared to polycrystalline silicon. However, the buried (sacrificial) oxide layer is unpatterned, making the direct application process as described in FIGS. 3 through 8 impossible. It is possible to imagine implementing the method to build hinges, but it only gets more complicated than the original method.

Figure 9:
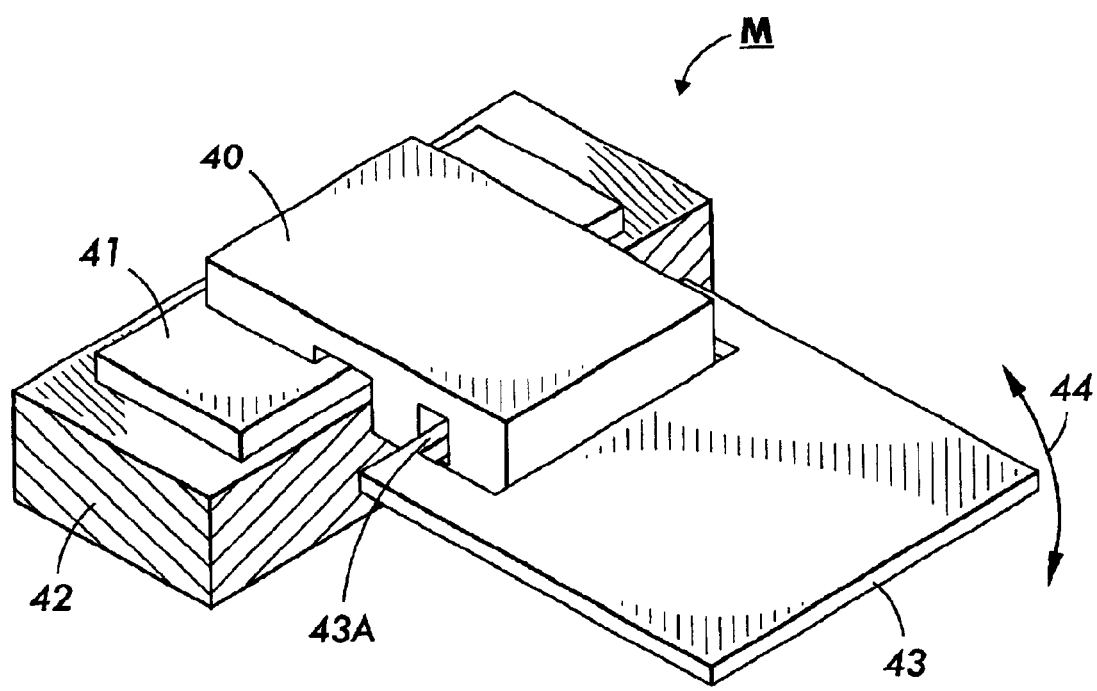
FIG. 9 is a three dimensional view of a single crystal silicon layer on an SOI wafer hinge structure.

The embodiments of the present invention as described herein proposes a different approach. Instead of having the hinge post stapled by two polysilicon layers, the invention describes a staple that completely surrounds the post with the same layer (deposition) as illustrated in FIG. 9. This design is possible by taking advantage of the conforming properties of polysilicon and thermally grown oxide, and the undercutting capability of a silicon dioxide wet etch. As illustrated there is shown a micro hinge device M comprising a substrate 42 which is the basic foundation for the micro-hinge device M. Supported on the substrate 42 is an anchor plate 41, and anchored to anchor plate 41 is staple member 40 which surrounds and holds hinge pin 42A. There is a layer of buried oxide positioned between anchor plate 41 and substrate 42 which layer is needed for electrical insulation. "Flap" or "moving plate" or "mirror" 43 can rotate in the direction of arrow 44 out of plane around hinge pin 43A. The anchor plate 41, the moving plate 43 and the pin are all made of single crystal silicon. The staple 40 is made of polycrystal silicon. All plates are electrically isolated from the substrate 42.

Figure 10:
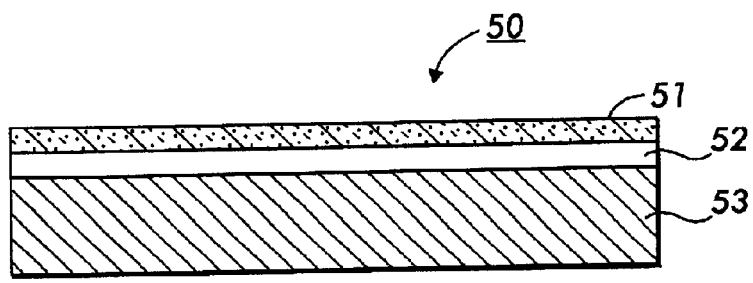
FIGS. 10, 11, 12, 13A, 13B and 14–16 are a series of plan views illustrating the process steps employed for manufacturing micro-hinges in accordance with the specific features of the process defined by the present invention.
Figure 11:
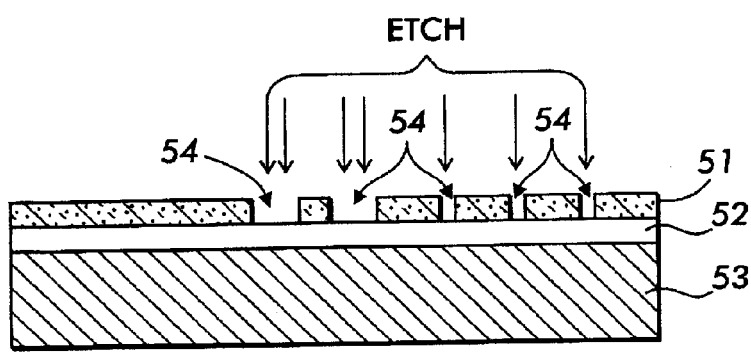
Figure 12:
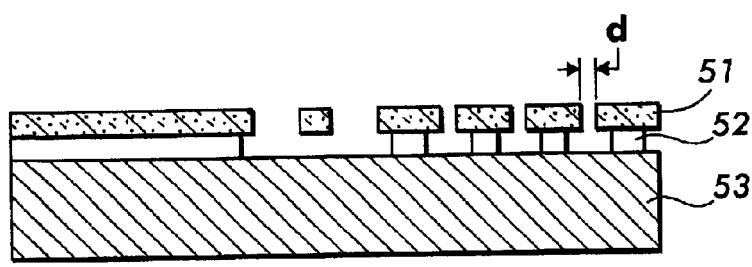
Figure 13A:
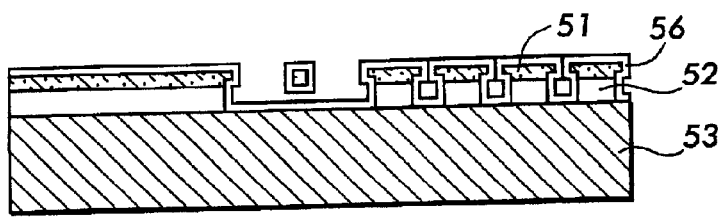
Figure 13B:
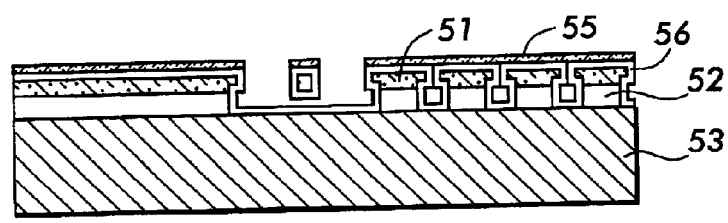
Figure 14:
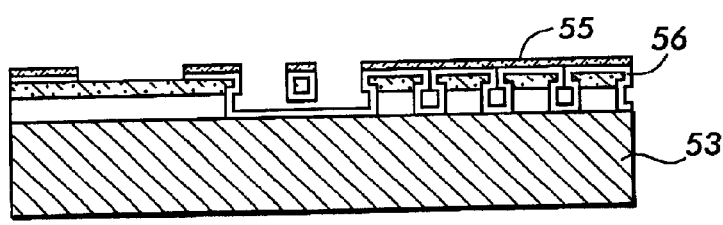
Figure 15:
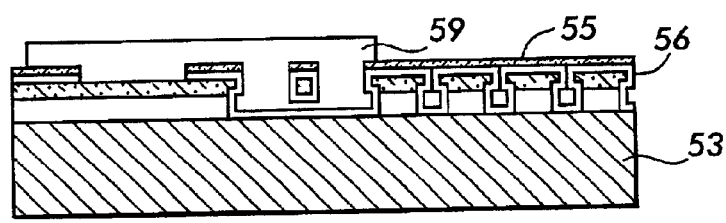
Figure 16:
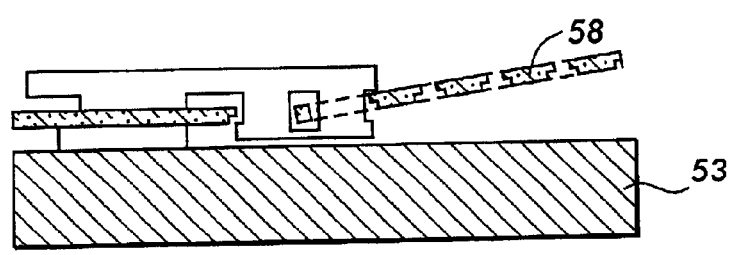

FIGS. 10 through 16 illustrate cross-sectional views of an MEM device during the primary fabrication steps in accordance with the specific process steps defined by the present invention. As shown in FIG. 10 the starting material is an SOI wafer 50 which comprises a single crystal silicon layer 50 having a preferred thickness of about one to about five microns. The crystal silicon layer 51 lies over a layer of buried oxide 52 which in turn lies on substrate 53, also a single crystal silicon layer. First, the slots are defined around the hinge pin as shown in FIG. 11 by an etch that forms trenches 54 (slots) into the silicon single crystal layer 51. Thereafter a wet etch is performed to remove the oxide under the hinge pin (FIG. 12). "d" defines the distance between each silicon crystal layer 51 on each pin 52 after the etching process. Thermal oxide 56 is grown in the next step (FIG. 13A) to define the gap between the pin and the to-be-deposited polysilicon cap. An optional thin layer of CVD oxide (LTO: low temperature oxide) 55 can be deposited immediately afterward to cover fine gaps not completely sealed by the thermal grown oxide in the field, plus to round off the slot opening (FIG. 13B). Because the width of the trench around the pin is larger, the CVD oxide will only round off the top corners, but won't seal off the trench opening. The thickness of the thermal oxide layer 56 is about one half the thickness of dimension "d" shown in FIG. 12 and the thickness of layer 55 LTO is less than half of the thickness of layer 56. Polysilicon anchor etch is performed in the next step (FIG. 14). Thereafter, polysilicon 59 is deposited (FIG. 15) and etched to define the hinge cap. Since polysilicon has excellent conformality, it will completely fill up the gap underneath the pin and warp around it. This feature allows the hinge 58 to be lifted off the plane completely (FIG. 16). For a direct comparison, it would take at least three (3) polysilicon depositions with traditional surface micro machining techniques to achieve the same functionality. In the last step, the sacrificial oxide is etched away by hydrofluric acid, and the mirror can be lifted out of plane. We can cascade the mirror plates to build lifted platforms.

Figure 17:
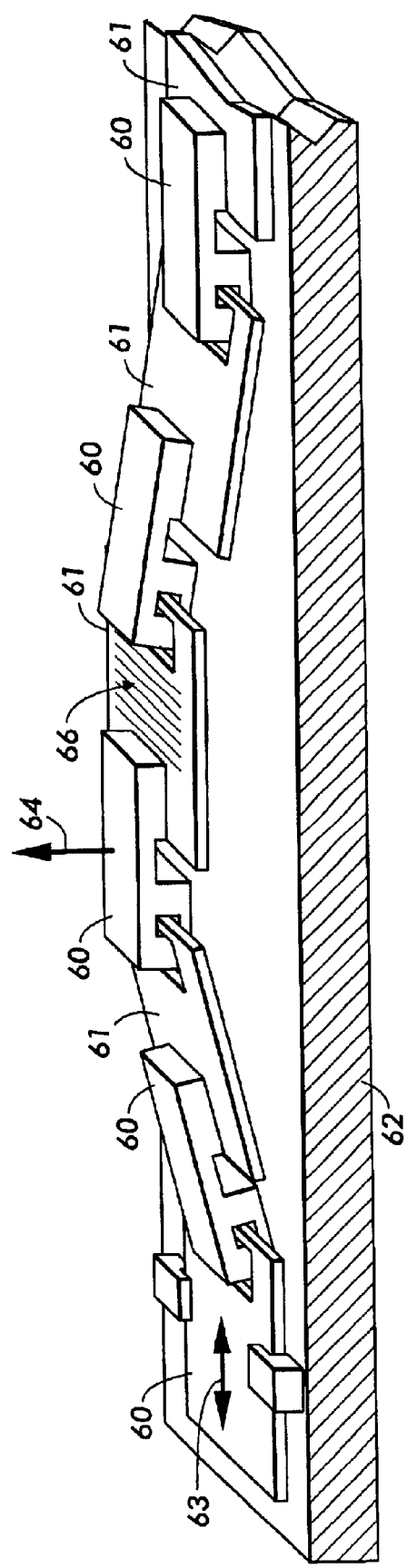
FIG. 17 is a three dimensional view of chained plates connected by self-aligned micro-hinges that form a platform that can be raised above the substrate of the platform at any angle.

FIG. 17 illustrates a hinge system made by the process of the present invention in the form of a chained platform connected by silicon self-aligned micro-hinges made in accordance with the features of the present invention that can be raised in the direction of arrow 64 at any angle. The hinge posts are all single crystal silicon as are the various platforms 61 all of which are supported on substrate 62. Fabricated movement will be in the direction of arrow 63, further to the left. Platform 61 is typically connected to a micro actuator to push it in the direction of arrow 63, i.e. to the right. When pushed in the direction of arrow 63, the entire structure is raised in the direction of arrow 64 (out of plane). Furthermore, the angle of each plate 61 will be controlled by movement in the direction of arrow 63.

As illustrated in the top portion of FIG. 17, surface 66 is positioned on platform 61. Surface 66 can be a metal reflector, a fine etched grating, for example, or a big hole.

Figure 18A:
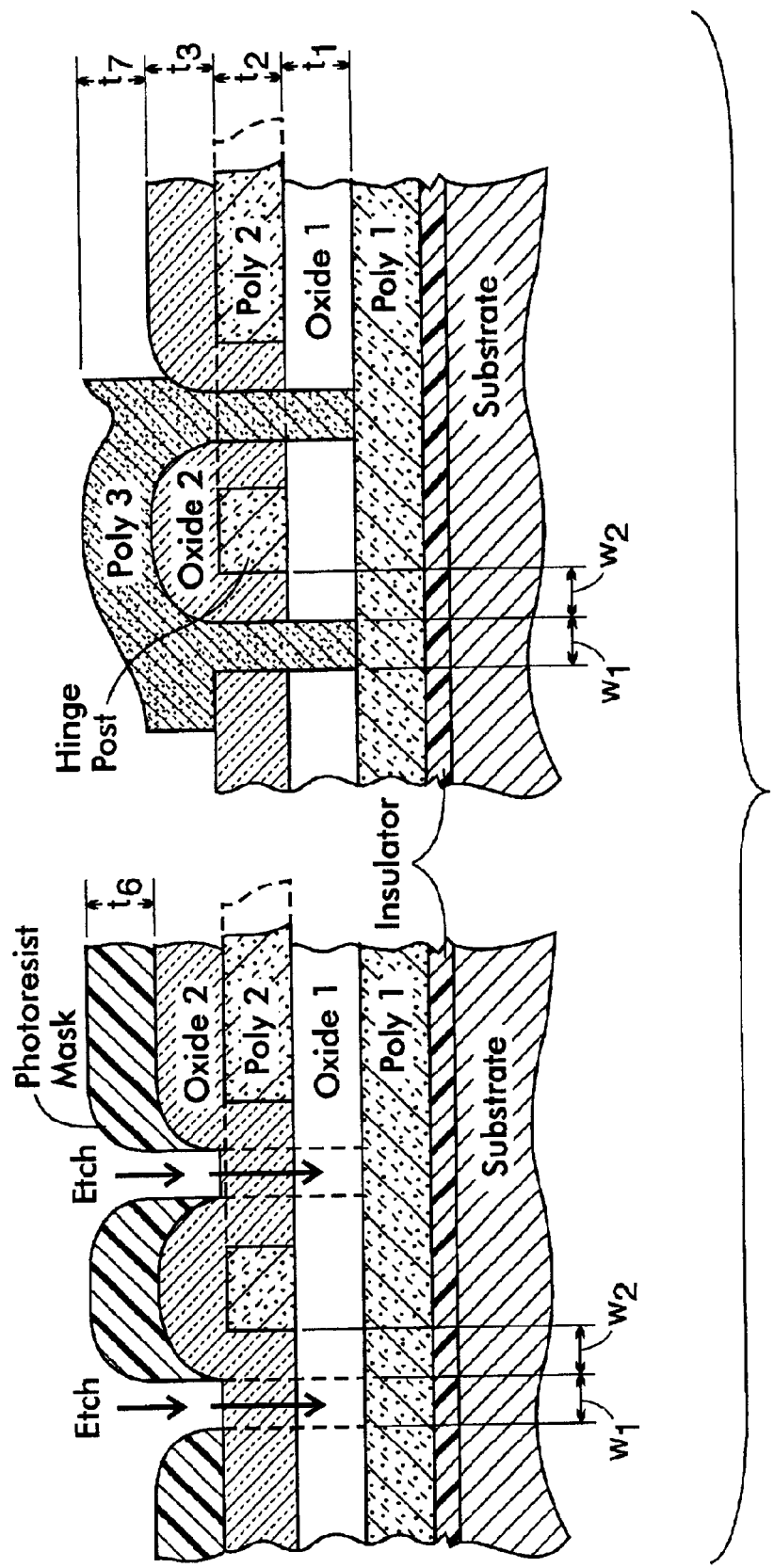
FIGS. 18A and 18B illustrate a comparison between a traditional micro-hinge and a micro-hinge made in accordance with the process of this invention.
Figure 18B:
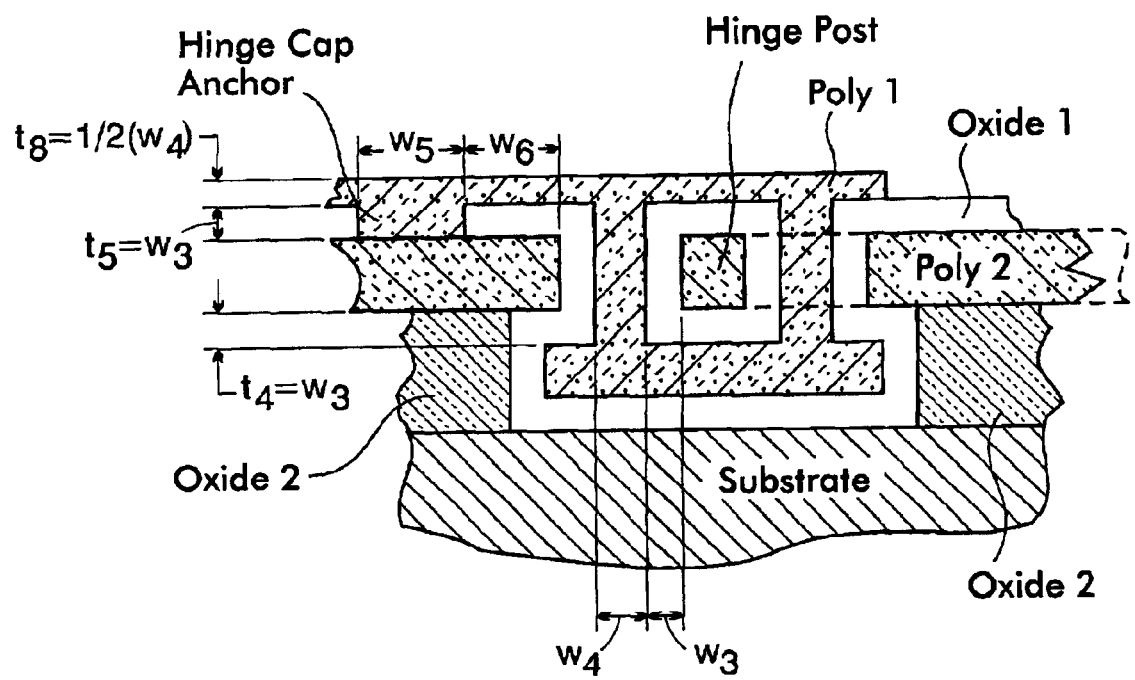

FIG. 18A is a further illustration of a traditional silicon hinge structure in which three layers of polycrystalline silicon is needed. This is in direct comparison to the self-aligned hinge (SAH) shown in FIG. 18B in accordance with the present invention in which only one layer of polycrystalline silicon is needed for the hinge structure. FIGS. 18A and 18B illustrate why (how) the tolerances of the self-aligned hinge (FIG. 18B) are better than that of known hinges as illustrated in FIG. 18A.

The hinge tolerance is defined by the gap between the hinge post (pin) and the cap that surrounds the post. For a traditional micro hinge, the gape is w2 on the side, and t1 and t3 on top and below. As for self-aligned micro-hinges made in accordance with the process described by the present invention, the gap is w3, and t4, t5, respectively.

For traditional hinges, t1 and t2 are determined by the thickness of oxide 1 and oxide 2. They typically are about 1.5 to 2.5 um. W2 is determined by the etching and alignment capability. Basically the w1 etch that is done prior to poly 3 deposition. W1 etch has to go through both oxide 1 and oxide 2 layers, therefore its etch mask must have a reasonable thickness (t6 in FIG. 18A). Also, layer-to-layer contact photolithography, typically used for building MEMS, has alignment accuracy no better than about 1–1.5 um. Therefore w2 has to be reasonably large enough to prevent accidental lithography alignment error that causes a shift of w1 etch and bridges poly 3 to poly 2 hinge post later on. It is typically about 3 um assuming a 1–1.5 um alignment accuracy. In addition, w1 has to be wide enough, usually 2–3 times of (t1+t3), and ensure a good etch and proper connection of poly 3 to poly 1 at the end of the process.

In the case of the self-aligned hinge (FIG. 18B), t4 should be approximately equal to t5 and w3 since they are all grown at the same time. Thermal oxide is "conformal", meaning its thickness is about equal everywhere. W3 should be around 1 um or no more than about 1.5 um. It should be just enough to get the hinge to turn. There is no additional lithography/etch steps that need to define the w4 hole, and there is no concern about alignment, mask thickness/step coverage . . . etc. W4 is about ½ of t8.

Thus, w2 is usually 3 um, and w3 is usually 1–1.5 um. Therefore, the micro hinges that are made in accordance with the process of the present invention have better tolerances. Adding that w1 is usually 4*(2~3)=8~12 um, and w4 is only 2~3 um, it is noted that micro hinges made in accordance with the process of the present invention are also smaller. But the size difference is not as significant because the cap needs to anchor down as well. The width w5 should be about twice of w3, and about 3 um. Spacing w6 will add another 4–5 um.

Figure 19:
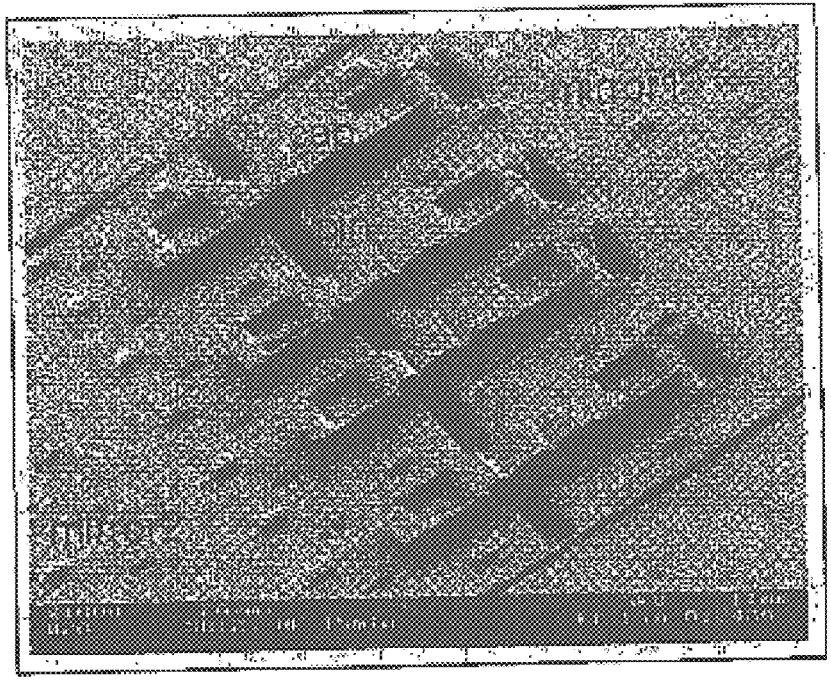
FIG. 19 and FIG. 20. are scanning electron microphotographs of self-aligned micro-hinges made in accordance with the process described herein.
Figure 20:
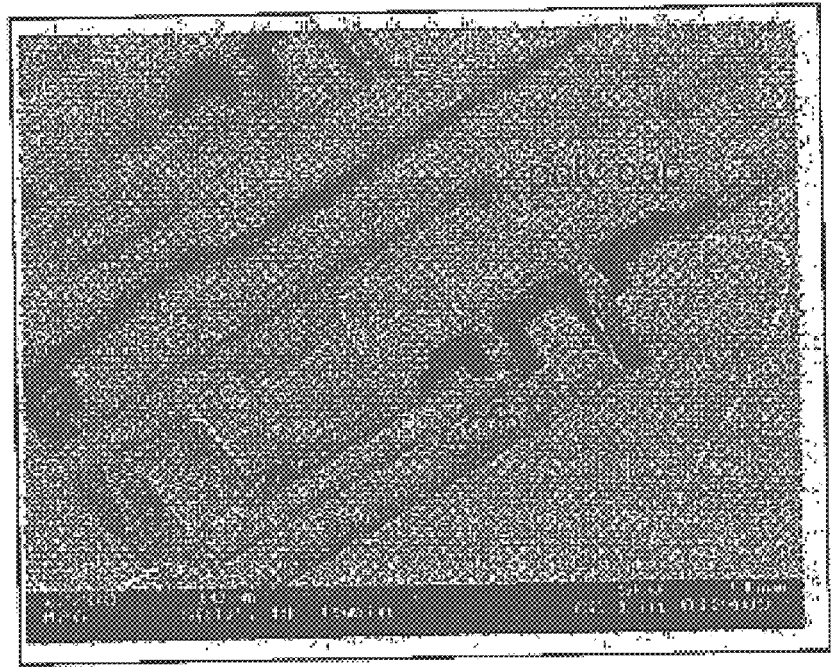

Scanning electron micrographs of self-aligned micro hinges are shown in FIGS. 19 and 20. In FIG. 19, four hinges connect the right mirror plate to the left. The pins are part of the right plate, and the poly caps anchors down to the left mirror plate. The sacrificial oxide has been removed and one can see that the poly cap wraps around the single crystal silicon hinge. In FIG. 19, the right hand side plate rotates up. A close-up view of another hinge is also shown in FIG. 20 to better illustrate the tight tolerance of the self-aligned hinges in accordance with the embodiments of the present invention.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A surface micromachining process for the fabrication of three-dimensional micro-hinges directly on silicon on insulator wafers comprising the steps of:

(a) defining openings around the surface of a desired hinge pin in a single layer of a silicon single crystal;

(b) subjecting the openings to an etching process for removal of oxide material that is located in contiguous relation to the openings under the area designated for a hinge;

(c) growing thermal oxide to define a gap between a hinge pin and a subsequently deposited polysilicon cap;

(d) depositing polysilicon and etching to define a hinge cap/staple; and (e) wet etching to remove grown oxide and allow a pin to rotate inside the cap/staple.

2. A surface micromachining process as in claim 1 wherein after step (c), immediately depositing a thin layer of a chemical vapor deposited oxide sufficient to cover fine gaps not completely covered by said thermal oxide.

3. A surface micromachining process as in claim 1 further comprising the step of lifting a connected mirror structure out of the silicon wafer.

4. A surface micromachining process as in claim 1 wherein said etching processes are dry etching processes.

5. A surface micromachining process as in claim 1 wherein said silicon single crystal layer is from about one to about five microns thick.

* * * * *

UNITED STATES PATENT AND TRADEMARK OFFICE
CERTIFICATE OF CORRECTION

| | |
|---|---|
| PATENT NO. | : 6,755,982 B2 |
| APPLICATION NO. | : 10/040687 |
| DATED | : June 29, 2004 |
| INVENTOR(S) | : Chuang-Chia Lin |

Page 1 of 1

It is certified that error appears in the above-identified patent and that said Letters Patent is hereby corrected as shown below:

Column 1, line 3, insert as a new paragraph:

This invention was made with Government support under 70NANB8H4014 awarded by NIST. The Government has certain rights in this invention.

Signed and Sealed this

First Day of May, 2007

JON W. DUDAS
*Director of the United States Patent and Trademark Office*